United States Patent
Srinath et al.

(10) Patent No.: US 7,724,015 B2
(45) Date of Patent: May 25, 2010

(54) DATA PROCESSING DEVICE AND METHODS THEREOF

(75) Inventors: Srinivasan Srinath, Bangalore (IN); Sudhir S. Kudva, Minneapolis, MN (US); Joel T. Irby, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 22 days.

(21) Appl. No.: 12/253,335

(22) Filed: Oct. 17, 2008

(65) Prior Publication Data
US 2010/0079162 A1 Apr. 1, 2010

(51) Int. Cl.
*G01R 31/26* (2006.01)
(52) U.S. Cl. .................. 324/763; 324/73.1; 324/765; 714/719; 714/733; 365/201
(58) Field of Classification Search .............. None
See application file for complete search history.

(56) References Cited

U.S. PATENT DOCUMENTS 5,006,787 A * 4/1991 Katircioglu et al. ........ 324/73.1
7,225,379 B2 * 5/2007 Yonaga ...................... 714/744

* cited by examiner

*Primary Examiner*—Minh N Tang

(57) ABSTRACT

A data processing device includes a first memory for use during normal operation of the device and a second memory for use during testing. The second memory stores a set of test patterns for testing of a functional module. When the data processing device is in a normal (i.e. non-test) mode of operation, data is retrieved from a first memory based on a received memory address. The retrieved data is applied to the functional module of the data processing device to perform a designated function. When the data processing device is in a test mode of operation, received memory addresses are provided to the second memory for retrieval of a test pattern associated with the address. The test pattern is applied to the functional module to generate an output pattern. The result of a test is determined by comparing the output pattern to an expected pattern.

20 Claims, 3 Drawing Sheets

DATA PROCESSING DEVICE AND METHODS THEREOF

CROSS-REFERENCE TO RELATED APPLICATION

This application claims priority to India Patent Application No. 2370/CHE/2008 filed Sep. 26, 2008, which is incorporated by reference as if fully set forth herein.

FIELD OF THE DISCLOSURE

The present disclosure relates to data processing devices and more particularly relates to testing of data processing devices.

BACKGROUND

After manufacture, a data processing device is typically tested to ensure the device behavior matches a specification. For a typical test, a test pattern is applied to an input of the data processing device and a resultant output pattern compared to an expected output pattern. The test pattern typically tests only a portion of the possible states of the data processing device. Accordingly, the data processing device is tested with a variety of different test patterns in order to increase the number of possible states tested. However, because of the complexity of modern data processing devices, it can be difficult to ensure that all possible states, or even likely states, of a data processing device have been tested by a given set of test patterns. Further, changes in the data processing device (such as a change resulting from an alteration in the device design) can render previous test patterns obsolete, requiring generation of new test patterns.

DETAILED DESCRIPTION

In accordance with a specific embodiment of the present disclosure, a data processing device includes a first memory for use during normal operation of the device and a second memory for use during testing. The second memory stores a set of test patterns for testing of a functional module. When the data processing device is in a normal (i.e. non-test) mode of operation, data is retrieved from a first memory based on a received memory address. The retrieved data is applied to the functional module of the data processing device to perform a designated function. When the data processing device is in a test mode of operation, received memory addresses are provided to the second memory for retrieval of a test pattern associated with the address. The test pattern is applied to the functional module to generate an output pattern. The result of a test is determined by comparing the output pattern to an expected pattern. By using a separate memory during test mode, specific test patterns can be applied to the functional module, rather than relying on information stored at the first memory that is not designed for testing of the functional module. Further, changes in the contents of the first memory do not require generation of a new set of test patterns to test the functional module.

Figure 1:
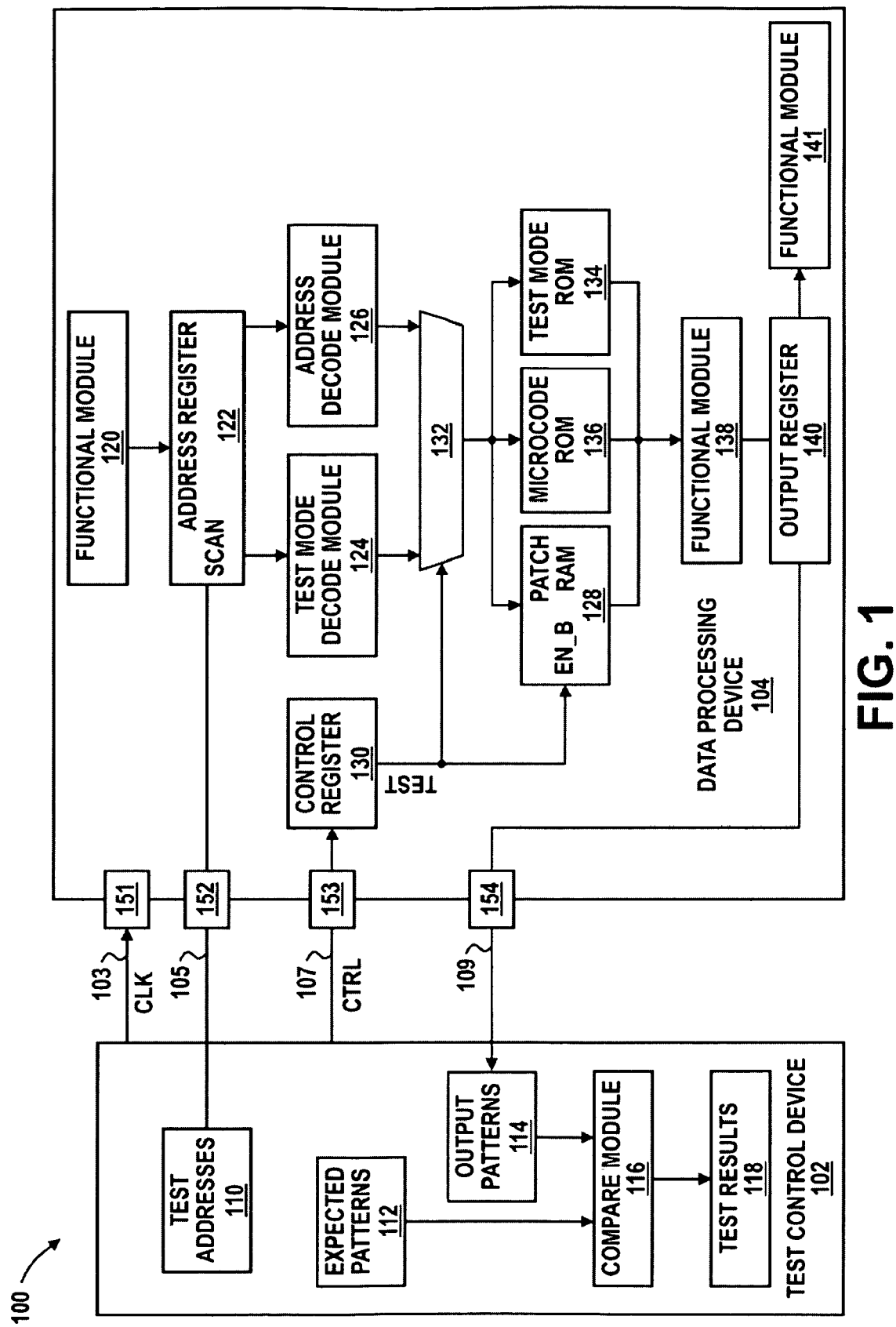
FIG. 1 is a block diagram of a data processing device testing system in accordance with one embodiment of the present disclosure.

Referring to FIG. 1, a block diagram of a particular embodiment of a system 100 for testing a data processing device 104 is illustrated. The system 100 includes a test control device 102 having an output connected to a bus 103 for communicating a clock signal (labeled "CLK"), an output connected to a bus 105, an output connected to a bus 107 for providing a control signal (labeled "CTRL"), and an input connected to a bus 109.

The test control device 102 stores a number of data patterns including a set of test addresses 110, a set of expected patterns 112, and a set of output patterns 114. The test control device 102 also includes a compare module 116 and a set of test results 118.

The data processing device 104 includes input/output (I/O) pins 151, 152, 153, and 154, and further includes functional modules 120, 138, and 141, an address register 122, a test mode decode module 124, an address decode module 126, and a patch random access memory (RAM) 128. The data processing device 104 further includes a control register 130, a multiplexer 132, a test mode read-only memory (ROM) 134, a microcode ROM 136, and an output register 140.

The I/O pin 151 is connected to the bus 103, I/O pin 153 is connected to the bus 105, I/O pin 153 is connected to the bus 107, and I/O pin 154 is connected to the bus 109. As used herein, an I/O pin refers to a connector of the data processing device 104 that can receive input signals from an external source, provide output signals to an external source, or any combination thereof.

The functional module 120 includes an output. The address register 122 includes a scan line input (labeled "SCAN") connected to the I/O pin 152, an input connected to the output of the functional module 120, and an output. The test mode decode module 124 includes an input connected to the output of the address register 122 and an output. The address decode module 126 includes an input connected to the output of the address register 122 and an output.

The control register 130 includes an input connected to the I/O pin 153 and an output to provide signal labeled "TEST." The multiplexer 132 includes an input connected to the output of the test mode decode module 124, an output connected to the output of the address decode module 126, a control input to receive the TEST signal, and an output. The test mode ROM 134 includes an input connected to the output of the multiplexer 132. The microcode ROM 136 includes an input connected to the output of the multiplexer 132. The patch RAM 128 includes an input connected to the output of the multiplexer 132, a control input labeled EN_B to receive the TEST signal, and an output. The functional module 138 includes an input connected to the output of the test mode ROM 134, connected to the output of the microcode ROM 136, and connected to the output of the patch RAM 128, and also includes an output. The output register includes an input connected to the output of the functional module 138, a first output connected to the I/O pin 154, and a second output. The functional module 141 includes an input connected to the second output of the output register 140.

In the illustrated embodiment, the data processing device 104 is a device such as a general purpose processor, application specific integrated circuit, and the like that can be configured to operate in either a normal mode or a test mode based on information stored at the control register 130. For example, the data processing device 104 can be placed in the test mode or the normal mode by storing one or more bits of information at the control register 130.

The functional modules 120, 138, and 141 are each configured to perform one or more designated functions in both the test and normal modes. As used herein, a functional module refers to one or more logic gates, storage elements, and the like, or any combination thereof, configured to perform the function associated with the functional module. For purposes of discussion, the function modules 120, 138, and 141 are assumed to be portions of an instruction pipeline of the data processing device 104. It will be appreciated that not all connections between elements are necessarily shown, for example connections between the clock signal and other elements are not explicitly shown, as the elements of each of the functional modules 120, 138, and 141 can be clocked by the CLK signal or other signal received at the I/O pin 151 so that the elements of each functional module operate in a synchronous manner.

In the normal mode of operation, the address register 122 is configured to receive memory addresses from the functional module 120. Further, the address register 122 is a scannable register, whereby in the test mode test addresses can be scanned into the register via the I/O pin 152.

The test mode decode module 124 is configured to receive a memory address and, based on the address, provide a decoded address value at the output. Similarly, the address decode module 126 is configured to receive a memory address and, based on the address, provide a decoded address value at the output. In an embodiment, the test mode decode module 124 and address decode module 126 will each provide a different decoded address value at their respective outputs in response to the same received memory address.

The test ROM 134 includes a number of memory locations whereby each location corresponds to a decoded address value. Each of the memory locations stores test information, such as a test pattern, configured to test the functional module 138. In response to receiving a decoded address value at the input, the test ROM 134 provides the corresponding test information at its output.

The microcode ROM 136 includes a number of memory locations whereby each location corresponds to a decoded address value. Each of the memory locations stores a data corresponding to a microcode instruction for an instruction pipeline of the data processing device 104. In response to receiving a decoded address value at the input, the microcode ROM 136 provides the corresponding pattern at the output.

The patch RAM 128 is enabled or disabled based on the state of the TEST signal received at the EN_B input. The patch RAM 128 includes memory locations, with each memory location corresponding to an address. When the patch RAM 128 is enabled, a decoded address value received at its input results in stored data at the decoded address being provided. When the patch RAM 128 is disabled, it does not provide data at the output.

In the illustrated embodiment, it is assumed that the memory locations of the microcode ROM 136 and the test mode ROM 134 each correspond to a non-overlapping range of decoded address values, while the memory locations of the patch RAM 128 and the test mode ROM 134 each correspond to the same range of decoded address values. For example, in the illustrated embodiment the memory locations of the microcode ROM 136 are assumed to correspond to a decoded address value range of 0 to 4063, while the memory locations of the patch RAM 128 and the test mode ROM 134 are assumed to each correspond to the decoded address value range of 4064-4095.

In operation, the data processing device 104 can be placed in the normal mode by storing a specified value to the control register 130. In response, the TEST signal is negated. In the normal mode, the functional module 120 stores address information based on decoded instructions at the address register 122. The address decode module 126 decodes the stored address to determine a decoded address value and communicates the value to the multiplexer 132.

Based on the negated state of the TEST signal, the multiplexer 132 connects the output of the address decode module 126 to the multiplexer output. Accordingly, the decode address value from the address decode module 126 is applied to the inputs of the patch RAM 128, the microcode ROM 136 and the test mode ROM 134. Depending on the decoded address value, either the patch RAM 128 or the microcode ROM 136 provides microcode stored at the location corresponding to the decoded address value via the corresponding output. The retrieved microcode is applied to the functional module 138, which performs its designated function based upon the retrieved microcode to provide an output value to the output register 140. The output register 140 stores the output value for access by the functional module 141.

Testing of the data processing device 104 can be initiated by storing data at the control register 130 to place the device in the test mode, thereby causing assertion of the TEST signal. In the test mode, the address register 122 receives a test address via the SCAN input. The test address corresponds to an address value such that a decoded address value based on the test pattern will correspond to a memory location of the test mode ROM 134.

The test mode decode module 124 decodes the test address stored at the address register 122 to determine the decoded address value, and provides the decoded address value to the multiplexer 132. Based on the asserted TEST signal, the multiplexer 132 connects the output of the test mode decode module to the multiplexer output, so that the decoded address value is provided to the TEST mode ROM 134, the microcode ROM 134, and the patch RAM 128. Because the decoded address value does not correspond to one of its memory locations, the microcode ROM 136 does not provide data at its output. Further, assertion of the TEST signal at the EN_B input causes the patch RAM 128 to be disabled. Accordingly, only the test mode ROM 134 provides output data in response to the decoded address value. As described above, the output data corresponds to information designed to test the functional module 138.

The test pattern retrieved from test mode ROM 134 as a result of the decoded address values is provided to the functional module 138. Based on the test pattern, the functional module 138 provides an output pattern for storage at the output register 140.

In operation, the test control device 102 is configured to test the data processing device 104 by providing the set of test addresses 110 via the bus 105 and reading resulting output patterns stored at the output register 140. The test control device 102 stores the output patterns at the set of output patterns 114. The test control device 110 employs the control module 116 to compare the output patterns 114 to the expected patterns 112 and, based on the comparison, determine the test results 118. For example, if one of the output patterns 114 differs from a corresponding one of the expected patterns 112, the compare module 116 can store an indication at the test results 118 that the device under test has not performed as expected. In an embodiment, the compare module 116 can determine, based on the output patterns 114, a particular portion of the device under test that caused a test failure and indicate the identified portion in the test results 114.

The test results 118 can be analyzed by a test engineer via a graphical user interface (not shown) or other interface to determine which of the test patterns 110 resulted in failed tests, which portions of the device under test caused the failed tests, and the like. The analysis allows the test engineer to qualify the device under test for release to a customer, identify design problems, and the like.

The test control device 102 provides the CLK signal to the device under test to synchronize the test process. In particular, provision of the test patterns 110 and receipt of output patterns 109 are synchronized to the CLK signal, so that particular test patterns can be correlated to particular output patterns. Further, the CLK signal synchronizes the synchronous elements of the device under test to allow the device to generate the output patterns 114.

Figure 2:
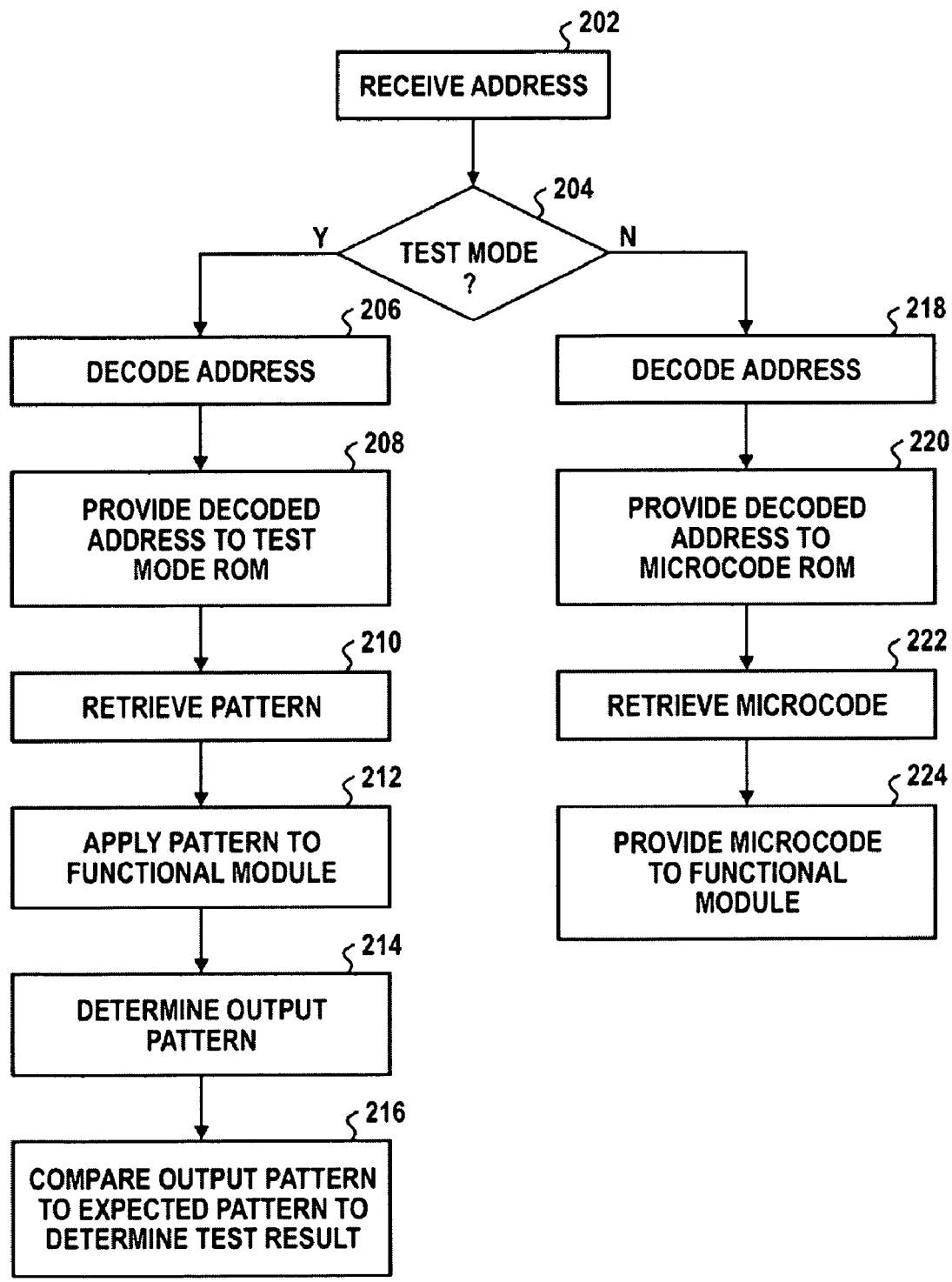
FIG. 2 is a flow diagram of a method of testing a data processing device in accordance with one embodiment of the present disclosure.

Referring to FIG. 2, a flow diagram of a particular embodiment of a method of testing a data processing device is illustrated. At block 202, the address register 122 receives an address. In the normal mode of operation, the address is received from functional module 120, while in the test mode of operation, the address is scanned into the address register 122 via the SCAN input. At block 204, the data processing device 104 determines, based on information stored at the control register 130, whether the device is in the normal mode or the test mode of operation.

In response to determining the data processing device 104 is in the test mode, the method flow proceeds to block 206, and the test mode decode module 124 decodes the address to determine a decoded address value. At block 208, the multiplexer 132 communicates the decoded address values to the test mode ROM 134. At block 210, the test mode ROM 134 retrieves a pattern from the memory location corresponding to the decoded address value. At block 212, the retrieved pattern is applied to the functional module 138. At block 214, the logic gates, storage elements, and other devices of the functional module 138 determine an output pattern based on the received pattern, and store the output pattern at the output register 140. At block 216, the test control device compares the output pattern to a corresponding on of the expected patterns 112 to determine a test result.

Returning to block 204, in response to determining the mode of operation of the data processing device 104 is the normal mode, the method flow proceeds to block 218 and the address decode module 126 decodes the received address to determine a decoded address value. At block 220, the multiplexer 132 provides the decoded address value to the microcode ROM 136. At block 222, the microcode ROM 136 retrieves microcode from the memory location corresponding to the decoded address value. At block 224, the microcode ROM 224 provides the retrieved microcode to the functional module 138, which performs its designated function based on the microcode.

Figure 3:
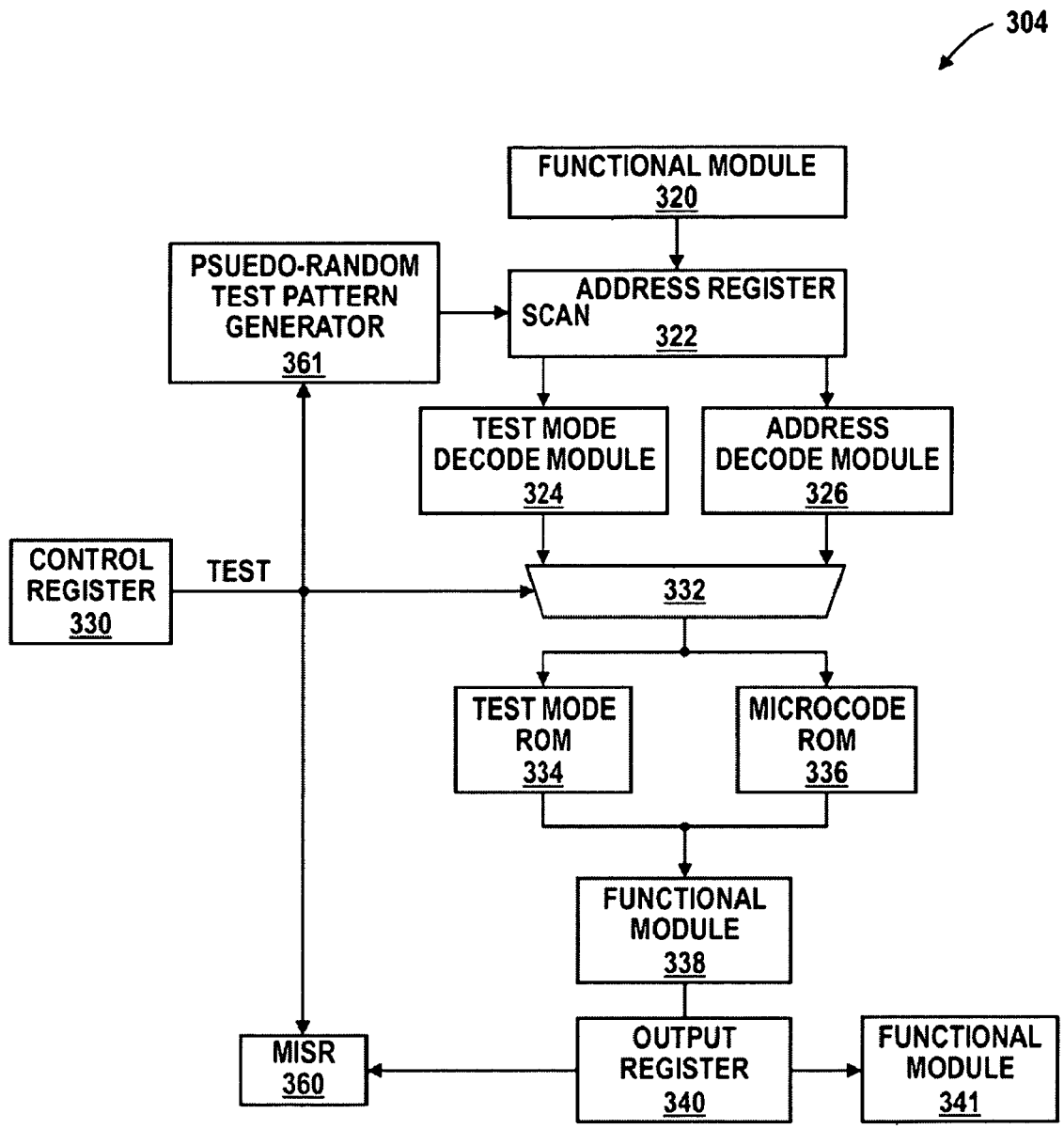
FIG. 3 is a block diagram of a data processing device in accordance with one embodiment of the present disclosure.

Referring to FIG. 3, a block diagram of a particular embodiment of a data processing device 304 is illustrated. The data processing device 304 includes functional modules 320, 338, and 341, an address register 322, a test mode decode module 324, and an address decode module 326. The data processing device 304 further includes a control register 330, a multiplexer 332, a test mode read-only memory (ROM) 334, a microcode ROM 336, and an output register 340. In addition, the data processing device 304 includes a multiple-input signature register (MISR) 360 and a pseudo-random test pattern generator (PRPG) 361.

The functional module 320 includes an output. The address register 322 includes a scan line input (labeled "SCAN"), an input connected to the output of the functional module 320, and an output. The test mode decode module 324 includes an input connected to the output of the address register 322 and an output. The address decode module 326 includes an input connected to the output of the address register 322 and an output.

The control register 330 includes an input connected to the I/O pin 353 and an output to provide signal labeled "TEST." The multiplexer 132 includes an input connected to the output of the test mode decode module 324, an output connected to the output of the address decode module 326, a control input to receive the TEST signal, and an output. The test mode ROM 334 includes an input connected to the output of the multiplexer 332. The microcode ROM 336 includes an input connected to the output of the multiplexer 332. The functional module 338 includes an input connected to the output of the test mode ROM 334 and connected to the output of the microcode ROM 336, and also includes an output. The output register includes an input connected to the output of the functional module 338, a first output, and a second output. The MISR 360 includes an input connected to the first output of the functional module and a control input to receive the TEST signal. The functional module 341 includes an input connected to the second output of the output register 340. The pseudo-random test pattern generator 361 includes an input to receive the TEST signal and an output connected to the SCAN input of the address register 322.

In operation, the data processing device 304 can operate in a normal mode or a test mode, in similar fashion to that described above with respect to data processing device 104 of FIG. 1. However, the data processing device 304 can also be placed in a self-test mode, referred to as a built-in self-test (BIST) mode. Software or a hardware module of the data processing device 304 can initiate the BIST mode by writing a value to the control register 330, causing assertion of the TEST signal. In response, the pseudo-random test pattern generator 361 generates one or more pseudo-random test patterns and provides each pattern to the address register 322. The test mode decode module 324 decodes each test pattern to determine an associated decoded address value, and the test mode ROM 334 retrieves patterns based on the decode address values, in similar fashion to that described above with respect to FIG. 1. The functional module 338 generates output patterns based on the retrieved patterns, and stores the output patterns at the output register 340.

In response to assertion of the TEST signal, the MISR 360 reads the output patterns from the output register 340, and determines an output value based on the output patterns. Software or a hardware module of the data processing device 304 can read the value at the MISR 360 and compare it to an expected value to determine if the functional module 338 is performing according to a specification. If the value indicates an error, the software or hardware module can take appropriate action, such as indicating a device error.

Other embodiments, uses, and advantages of the disclosure will be apparent to those skilled in the art from consideration of the specification and practice of the disclosure disclosed herein. For example, although the microcode ROM 136 is described as storing microcode, in other embodiments the ROM can store other information, such as BIOS information, configuration information, and the like. In addition, in other embodiments a random access memory can be employed in place of the ROM 136. It will further be appreciated that, although some circuit elements and modules are depicted and described as connected to other circuit elements, the illustrated elements may also be coupled via additional circuit elements, such as resistors, capacitors, transistors, and the like. The specification and drawings should be considered exemplary only, and the scope of the disclosure is accordingly intended to be limited only by the following claims and equivalents thereof.

What is claimed is:

1. A method, comprising:
   receiving a memory address at an integrated circuit device;
   in response to determining a mode of operation of the integrated circuit device is a first mode, retrieving first data from a first memory based on the memory address; and
   in response to determining the mode of operation is a second mode, retrieving a test pattern from a second memory based on the memory address, the test pattern configured to test a functional module of the integrated circuit device.

2. The method of claim 1, wherein the first data comprises microcode to be executed by the functional module.

3. The method of claim 1, wherein the device is determined to be in the first mode in response to the memory address being received at a first input, and the device is determined to be in the second mode in response to the memory address being received at a second input.

4. The method of claim 1, further comprising:
   in response to determining the mode of operation is the first mode, enabling a patch module of the device to be in an enabled state, the patch module configured to provide data from a third memory in response to the memory address when the patch module is in the enabled state; and
   in response to determining the mode of operation is the second mode, disabling the patch module to be in a disabled state.

5. The method of claim 1, wherein receiving the memory address comprises receiving the memory address via a scan chain input when the mode of operation is the second mode.

6. The method of claim 1, further comprising:
   in response to determining the mode of operation is a second mode, receiving first information from the functional module the functional module based on the test pattern; and
   comparing the first information to expected information to determine a test result.

7. The method of claim 1, wherein the first memory and the second memory are read only memories.

8. The method of claim 1, wherein the first memory is a random access memory and the second memory is a read only memory.

9. The method of claim 1, wherein the second mode of operation corresponds to a built-in self-test (BIST) mode of the device.

10. A method, comprising:
    receiving a memory address;
    in response to determining a first mode of operation, retrieving first data associated with the memory address from a first memory; and
    in response to determining a second mode of operation, retrieving a test pattern from a second memory, the test pattern configured to a functional module coupled to the first memory.

11. The method of claim 10, wherein the first data corresponds to a first processor instruction.

12. The method of claim 10, further comprising:
    receiving first information from the functional module based on the test pattern in response to determining the second mode of operation; and
    comparing the first information to expected information to determine a test result.

13. The method of claim 10, wherein receiving the memory address comprises:
    receiving the memory address from a first input in the first mode of operation; and
    receiving the memory address from a scan chain input in the second mode of operation.

14. A device, comprising:
    an address register configured to store a memory address, the address register comprising an output;
    a first decode module comprising an input coupled to the output of the address register and an output;
    a second decode module comprising an input coupled to the output of the address register and an output;
    a multiplexer comprising a first input coupled to the output of the first decode module, a second input coupled to the output of the second decode module, a control input configured to receive a control signal indicative of a test mode of the device, and an output, the multiplexer configured to selectively couple the first input or the second input to the output based on the control signal;
    a first memory comprising an input coupled to the output of the multiplexer; and
    a second memory comprising an input coupled to the output of the multiplexer, the second memory configured to store a plurality of test patterns associated with the device.

15. The device of claim 14, wherein the first memory is configured to store microcode associated with execution of instructions at the device.

16. The device of claim 14, wherein the address register further comprises a first input and a second input, the first input coupled to a functional module of the device, the second input coupled to an external input of the device.

17. The device of claim 14, wherein the address register further comprises a first input and a second input, and further comprising:
    a functional module comprising an output coupled to the first input of the address register; and
    a pseudo-random test pattern generator comprising a control input configured to receive the control signal and an output configured to provide a pseudo-random test pattern in response to the control signal indicating a test mode, the output coupled to the second input of the address register.

18. The device of claim 14, wherein the first memory comprises a first output and the second memory comprises a second output, and further comprising:
    a functional module comprising an input coupled to the first output and coupled to the second output and an output; and
    an output register comprising an input coupled to the output of the functional module and an output.

19. The device of claim 18, wherein the output of the output register is coupled to an external output of the device.

20. The device of claim 18, further comprising a multiple-input-signature-register (MISR) comprising an input coupled to the output of the output register.

* * * * *